United States Patent
Lin et al.

(10) Patent No.: US 11,742,247 B2
(45) Date of Patent: Aug. 29, 2023

(54) EPITAXIAL GROWTH OF SOURCE AND DRAIN MATERIALS IN A COMPLEMENTARY FIELD EFFECT TRANSISTOR (CFET)

(71) Applicant: Synopsys, Inc., Mountain View, CA (US)

(72) Inventors: Xi-Wei Lin, Fremont, CA (US); Victor Moroz, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 40 days.

(21) Appl. No.: 17/372,231

(22) Filed: Jul. 9, 2021

(65) Prior Publication Data

US 2022/0020646 A1  Jan. 20, 2022

Related U.S. Application Data

(60) Provisional application No. 63/053,499, filed on Jul. 17, 2020.

(51) Int. Cl.
*H01L 21/8238* (2006.01)
*H01L 27/092* (2006.01)
(Continued)

(52) U.S. Cl.
CPC .. *H01L 21/823814* (2013.01); *H01L 21/8221* (2013.01); *H01L 21/823807* (2013.01);
(Continued)

(58) Field of Classification Search
CPC ......... H01L 21/8221; H01L 21/823814; H01L 21/823807; H01L 27/0688; H01L 27/088;
(Continued)

(56) References Cited

U.S. PATENT DOCUMENTS 9,397,049 B1  7/2016 Fan et al.
9,653,575 B1  5/2017 Basker et al.
(Continued)

FOREIGN PATENT DOCUMENTS

EP  3675158 A2  7/2020
TW  201635493 A  10/2016
(Continued)

OTHER PUBLICATIONS

Ryckaert, J et al, "The Complementary FET (CFET) for CMOS scaling beyond N3", 2018 IEEE Symposium on VLSI Technology, IEEE, Jun. 18, 2018, pp. 141-142.

*Primary Examiner* — Michael M Trinh
(74) *Attorney, Agent, or Firm* — Haynes Beffel & Wolfeld LLP; Andrew L. Dunlap

(57) ABSTRACT

A method of performing epitaxial growth of a source and drain on levels of a complementary field effect transistor (CFET) is provided. The method includes depositing a first blocking material in a vertical channel of an unfinished CFET structure, oxidizing silicon at a surface of an upper level of the CFET to provide one or more $SiO_2$ protective layers, etching away a portion of silicon from a lower level of the CFET to form a lateral recess that is exposed to the vertical channel, and performing silicon epitaxial growth in the lower level of the unfinished CFET structure. Further, after the silicon epitaxial growth on the lower level, the method includes depositing a second blocking material in the vertical channel to cover at least a portion of the silicon epitaxial growth in the lower level, removing the $SiO_2$ protective layer, and performing epitaxial growth on the upper level.

20 Claims, 8 Drawing Sheets

(51) Int. Cl.
*H01L 21/822* (2006.01)
*H01L 29/08* (2006.01)
*H01L 27/06* (2006.01)
*H01L 29/423* (2006.01)
*H01L 29/06* (2006.01)
*H01L 29/775* (2006.01)

(52) U.S. Cl.
CPC .. *H01L 21/823885* (2013.01); *H01L 27/0688* (2013.01); *H01L 27/092* (2013.01); *H01L 29/0847* (2013.01); *H01L 29/42392* (2013.01); H01L 29/0673 (2013.01); H01L 29/775 (2013.01)

(58) Field of Classification Search
CPC ............... H01L 27/092; H01L 27/0922; H01L 29/0847; H01L 29/42392; H01L 29/0673; H01L 29/775; B82Y 10/00
See application file for complete search history.

(56) References Cited

U.S. PATENT DOCUMENTS

| | | | |
|---|---|---|---|
| 10,177,227 | B1 | 1/2019 | Yoshida et al. |
| 10,236,217 | B1 | 3/2019 | Ando et al. |
| 10,236,292 | B1 | 3/2019 | Frougier et al. |
| 10,256,158 | B1* | 4/2019 | Frougier ............... H01L 29/161 |
| 10,269,929 | B2 | 4/2019 | Wostyn et al. |
| 10,388,519 | B2 | 8/2019 | Smith et al. |
| 10,546,925 | B2* | 1/2020 | Reznicek .......... H01L 29/66545 |
| 10,833,003 | B1 | 11/2020 | Chou et al. |
| 11,227,922 | B2 | 1/2022 | Li et al. |
| 2009/0014806 | A1 | 1/2009 | Ostermayr et al. |
| 2009/0081815 | A1 | 3/2009 | Yamashita et al. |
| 2011/0003256 | A1 | 1/2011 | Van Der Heijden et al. |
| 2015/0333131 | A1 | 11/2015 | Mojumder et al. |
| 2016/0247722 | A1 | 8/2016 | Zhang et al. |
| 2018/0026042 | A1 | 1/2018 | Smith et al. |
| 2018/0374791 | A1 | 12/2018 | Smith et al. |
| 2019/0051523 | A1 | 2/2019 | Huang et al. |
| 2019/0109136 | A1 | 4/2019 | Ching et al. |
| 2019/0131184 | A1* | 5/2019 | Ando ..................... H01L 27/092 |
| 2019/0172755 | A1* | 6/2019 | Smith ................. H01L 21/3065 |
| 2019/0288004 | A1 | 9/2019 | Smith et al. |
| 2020/0035569 | A1 | 1/2020 | Frougier et al. |
| 2020/0105671 | A1 | 4/2020 | Lai et al. |
| 2020/0111670 | A1 | 4/2020 | Huang et al. |
| 2021/0098294 | A1 | 4/2021 | Smith et al. |
| 2021/0366907 | A1* | 11/2021 | Liao ..................... H01L 27/0924 |
| 2022/0020647 | A1* | 1/2022 | Lin .................... H01L 21/76895 |
| 2022/0037497 | A1* | 2/2022 | Chung ................ H01L 21/8221 |
| 2022/0157936 | A1* | 5/2022 | Khaderbad ....... H01L 29/66439 |
| 2022/0165730 | A1* | 5/2022 | Chen ............... H01L 21/823814 |

FOREIGN PATENT DOCUMENTS

| | | |
|---|---|---|
| TW | 201913821 A | 4/2019 |
| TW | 201917893 A | 5/2019 |
| TW | 201937611 A | 9/2019 |
| TW | 201939747 A | 10/2019 |
| TW | 202018825 A | 5/2020 |
| TW | 202025448 A | 7/2020 |
| WO | 2020065916 A1 | 4/2020 |
| WO | 2020137660 A1 | 7/2020 |

* cited by examiner

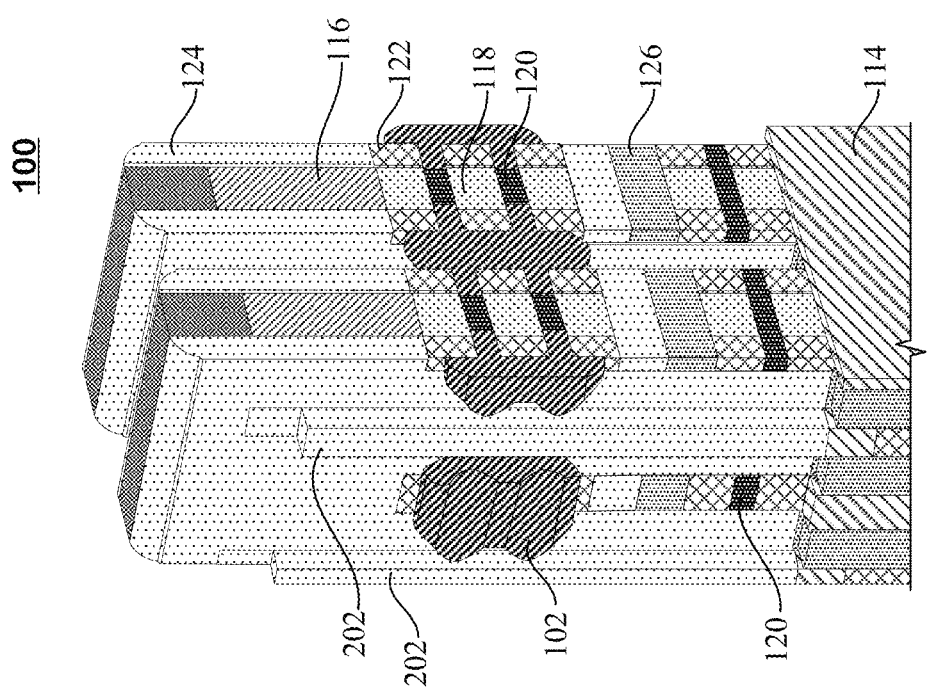
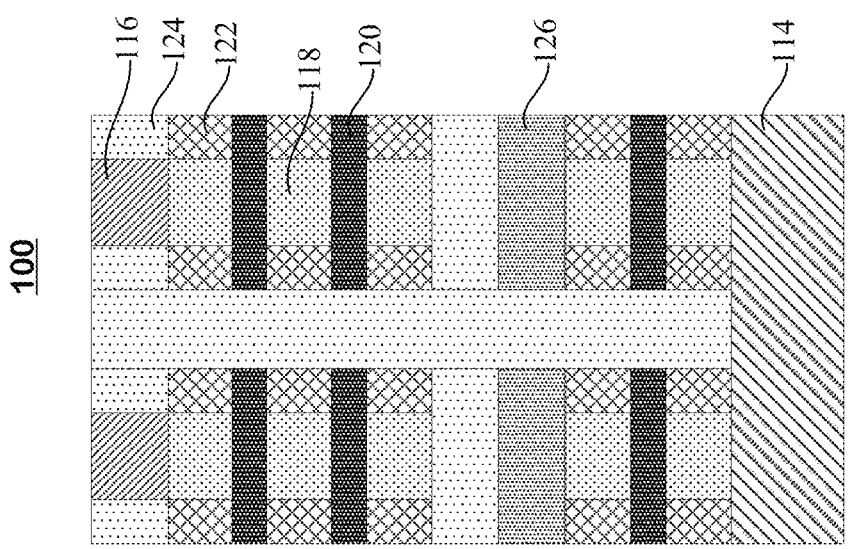
FIG. 2B
FIG. 2A

EPITAXIAL GROWTH OF SOURCE AND DRAIN MATERIALS IN A COMPLEMENTARY FIELD EFFECT TRANSISTOR (CFET)

RELATED APPLICATION

This application claims priority under 35 U.S.C. § 119(e) to U.S. Provisional Application No. 63/053,499, entitled "EPITAXIAL GROWTH OF SOURCE AND DRAIN MATERIALS IN A COMPLEMENTARY FIELD EFFECT TRANSISTOR (CFET)", filed on Jul. 17, 2020.

TECHNICAL FIELD

The present disclosure relates to epitaxial growth of source and drain materials in a stacked transistor architecture, such as CFET (complementary field effect transistor).

BACKGROUND

Transistor stacking, such as the stacking implemented in a complementary field effect transistor (CFET), is a candidate for transistor density scaling and sustainment of Moore's Law in the next 5-10 years. The concept behind CFET is to scale in 3D, by stacking one transistor on another vertically, resulting in density doubling with the same feature size. This CFET architecture requires innovative methods of manufacturing that have not been implemented when manufacturing a single transistor stack.

SUMMARY

The technology disclosed provides a process for performing epitaxial growth of a source or drain on a lower level of a complementary field effect transistor (CFET) (or other type of stacked transistor architecture) and then subsequently performing epitaxial growth of a source or drain on an upper level of the CFET (or other type of stacked transistor architecture).

In an aspect of the technology disclosed a method of performing epitaxial growth to form at least a portion of a source and a drain on multiple levels of a complementary field effect transistor (CFET) is provided. The method can include depositing a first blocking material in a vertical channel of an unfinished CFET structure, oxidizing silicon at a surface of an upper level of the unfinished CFET structure to provide one or more $SiO_2$ protective layers in the upper level, etching away a portion of silicon from a lower level of the unfinished CFET structure to form a lateral recess that is exposed to the vertical channel, and performing silicon epitaxial growth in the lower level of the unfinished CFET structure including at least a portion of the lateral recess to form the portion of one of the source and the drain. Further, after the performing of the silicon epitaxial growth on the lower level, the method can include depositing a second blocking material in the vertical channel to cover at least a portion of the silicon epitaxial growth in the lower level, removing the one or more $SiO_2$ protective layers, and performing epitaxial growth on the upper level of the unfinished CFET structure to form the portion of another of the source and the drain.

In another aspect of the technology disclosed, the upper level can be a negative-channel metal oxide semiconductor and the lower level can be a positive-channel metal oxide semiconductor.

In a further aspect of the technology disclosed, the first blocking material can include at least one of carbon-based material, aluminum oxide, silicon nitride-based materials, and carbon-doped silicon oxide (SiCOH).

In another aspect of the technology disclosed, the method can include, prior to the oxidizing of the silicon at the surface of the upper level, performing a first partial etch-back of the deposited first blocking material to leave some of the first blocking material in the vertical channel in the lower level.

In a further aspect of the technology disclosed, the method can further include, after the oxidizing of the silicon at the surface of the upper level, performing a second etch-back of the deposited first blocking material by removing a remainder of the first blocking material from the vertical channel.

In another aspect of the technology disclosed, the method can further include, after the oxidizing of the silicon at the surface of the upper level, performing a second etch-back of the deposited first blocking material by etching away a desired portion, but not all, of the first blocking material from the vertical channel.

In a further aspect of the technology disclosed, the portion of the silicon etched away can be a portion of a silicon nanosheet.

In another aspect of the technology disclosed, the etching away of the portion of the silicon from the lower level can be performed using at least one of chemical etching, plasma etching and isotropic etching, to selectively remove the silicon without affecting other portions of the lower level.

In a further aspect of the technology disclosed, the silicon epitaxial growth performed on the lower level can be SiGe epitaxial growth.

In another aspect of the technology disclosed, the silicon epitaxial growth on the lower level can be p+ S/D epitaxy to form p+ SiGe.

In a further aspect of the technology disclosed, the method can further include, after the performing of the silicon epitaxial growth on the lower level, removing a remainder of the first blocking material from the vertical channel.

In another aspect of the technology disclosed, the second blocking material can be the same material as the first blocking material.

In a further aspect of the technology disclosed, the second blocking material can be different from the first blocking material.

In another aspect of the technology disclosed, the method can further include etching back the second blocking material from the upper level to leave a desired amount of the second blocking material in the lower level.

In another aspect of the technology disclosed, the method can further include, after the removing of the one or more $SiO_2$ protective layers, etching away a portion of silicon from the upper level to form a lateral recess that is exposed to the vertical channel.

In another aspect of the technology disclosed, the portion of the silicon that is etched away from the upper level is a portion of a silicon nanosheet.

In a further aspect of the technology disclosed, the silicon epitaxial growth performed on the upper level can be SiGe epitaxial growth.

In another aspect of the technology disclosed, the epitaxial growth on the upper level can be n+ S/D epitaxy to form n+ doped silicon.

In a further aspect of the technology disclose, a system for performing epitaxial growth to form at least a portion of a source and drain on multiple levels of a complementary field effect transistor (CFET) is provided. The system can include a memory storing instructions, and a processor, coupled with the memory and to execute the instructions. The instructions when executed cause the processor to deposit a first blocking material in a vertical channel of an unfinished CFET structure, oxidize silicon at a surface of an upper level of the unfinished CFET structure to provide one or more $SiO_2$ protective layers in the upper level, etch away a portion of silicon from a lower level of the unfinished CFET structure to form a lateral recess that is exposed to the vertical channel and perform silicon epitaxial growth in the lower level of the unfinished CFET structure including at least a portion of the lateral recess to form the portion of one of the source and the drain. Further, after the performing of the silicon epitaxial growth on the lower level, the processor can deposit a second blocking material in the vertical channel to cover at least a portion of the silicon epitaxial growth in the lower level, remove the one or more $SiO_2$ protective layers, and perform epitaxial growth on the upper level of the unfinished CFET structure to form the portion of another of the source and the drain.

In another aspect of the technology disclosed, a non-transitory computer readable storage medium comprising stored instructions is provided. The instruction can be for performing epitaxial growth to form at least a portion of a source and a drain in multiple levels of a complementary field effect transistor (CFET). Further, the instructions, which when executed by a processor, cause the processor to implement operations including depositing a first blocking material in a vertical channel of an unfinished CFET structure, oxidizing silicon at a surface of an upper level of the unfinished CFET structure to provide one or more $SiO_2$ protective layers in the upper level, etching away a portion of silicon from a lower level of the unfinished CFET structure to form a lateral recess that is exposed to the vertical channel, performing silicon epitaxial growth in the lower level of the unfinished CFET structure including at least a portion of the lateral recess to form the portion of the source and the drain, and after the performing of the silicon epitaxial growth on the lower level, depositing a second blocking material in the vertical channel to cover at least a portion of the silicon epitaxial growth in the lower level, removing the one or more Sift protective layers, and performing epitaxial growth on the upper level of the unfinished CFET structure to form the portion of another of the source and the drain.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 2A illustrates a two-dimensional view of the upper level and the lower level of an unfinished CFET structure (prior to any epitaxial growth) being comprised of different materials and doping types.

FIG. 2B illustrates a three-dimensional view of the upper level and the lower level of an unfinished CFET structure (after upper level epitaxial growth) being comprised of different materials and doping types and illustrates potential problems with performing the upper level epitaxial growth before the lower level epitaxial growth.

DETAILED DESCRIPTION

Aspects of the present disclosure relates to performing epitaxial growth of source and drain materials in a complementary field effect transistor (CFET) (or other type of stacked transistor architecture). One unique aspect of a CFET, in comparison to a single transistor stack, is the manufacturing sequence of forming a lower level stack and an upper level stack and interconnections between the two levels. The technology disclosed provides a process of performing epitaxial growth for transistor source and drain components of the CFET.

Specifically, the technology disclosed performs a sequence of steps for epitaxial growth of a source and a drain at lower and upper transistor levels of a CFET. Epitaxial growth (or epitaxy) refers to natural or artificial growth of crystals on a crystalline substrate. The technology disclosed implements a specific order of epitaxy from a lower level stack to a higher-level stack of the CFET, which is achieved using a blocking material to cover one level while epitaxially growing source/drain material on another level. If the upper level epitaxy were performed first, the grown source/drain epitaxial material can block chemical gases' access to the lower level stack for source/drain epitaxy growth. Silicon oxidation is also used to selectively block epitaxial growth, so as to prevent the epitaxial growth from moving from the lower level to the upper level or from moving from the upper level to the lower level. The process implemented by the technology disclosed provides many benefits, including providing a pathway to enable CFET manufacturing with realistic unit processes and robust integration.

Figure 1:
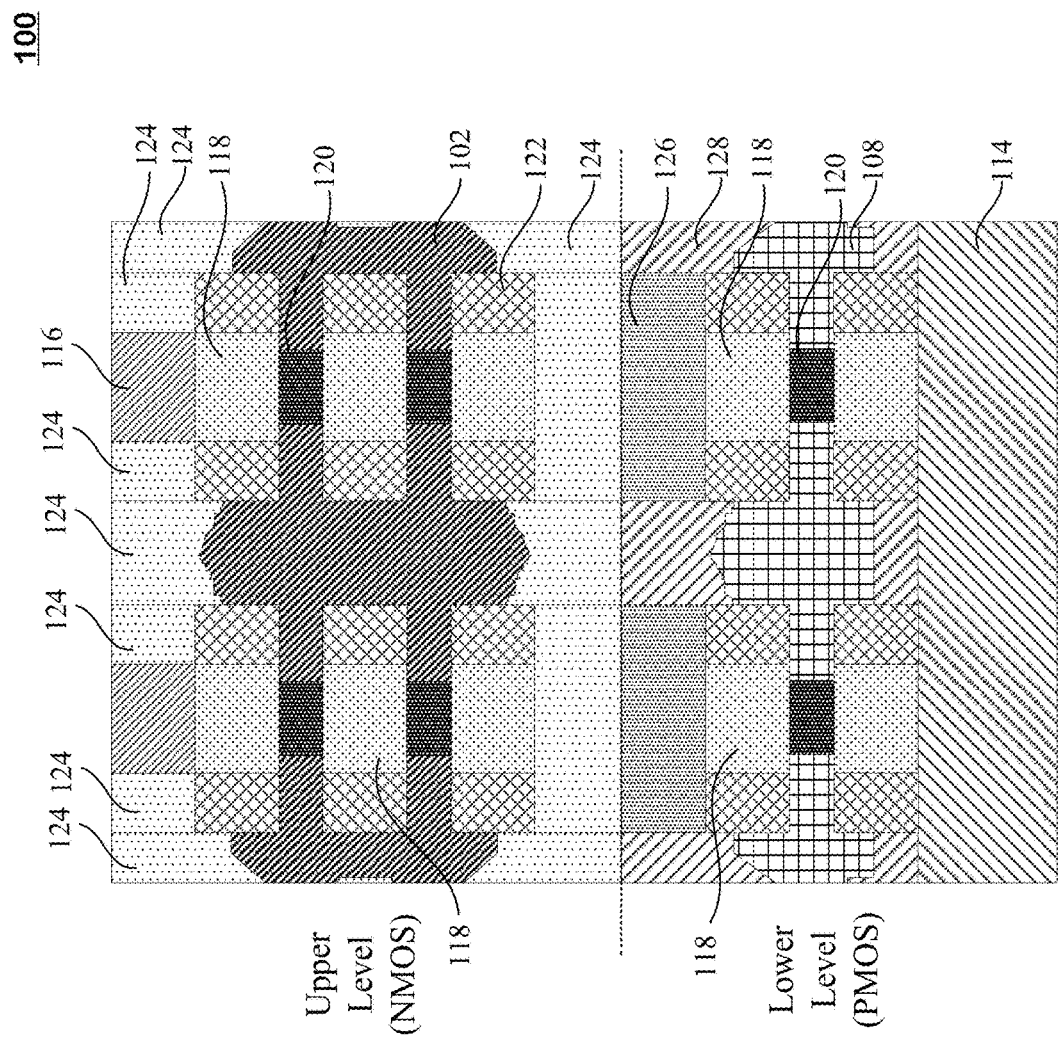
FIG. 1 illustrates a complementary field effect transistor (CFET) having an upper level (negative-channel metal oxide semiconductor (NMOS)) and a lower level (positive-channel metal oxide semiconductor (PMOS)) formed using epitaxial growth.

FIG. 1 illustrates a complementary field effect transistor (CFET) having an upper level (negative-channel metal oxide semiconductor (NMOS)) and a lower level (positive-channel metal oxide semiconductor (PMOS)) formed using epitaxial growth.

Specifically, FIG. 1 illustrates a CFET transistor 100 having source and drain (S/D) epitaxy. The CFET transistor includes two levels of nanosheet transistors stacked vertically. The two levels of nanosheet transistors include (i) an upper level, with, for example, n+ silicon epitaxy (n+ doped silicon) 102 forming an NMOS source (NMOS source contact not illustrated) and an NMOS drain (NMOS drain contact not illustrated) and (ii) a lower level, with, for example, p+ silicon epitaxy (p+ doped SiGe) 108 forming a PMOS source (PMOS source contact not illustrated) and a PMOS drain (PMOS drain contact not illustrated). The structure of the source and drain epitaxy of the CFET architecture includes a plurality of surrounding materials overlying a silicon substrate 114. The source and drain epitaxy is required for transistor connection to other devices and a power supply, in addition to transistor performance engineering, such as lowering external resistance and boosting PMOS mobility by stressor SiGe (e.g., since SiGe has a larger lattice constant than Si crystal, growing SiGe on Si from the side can exert lateral compressive force to a transistor Si channel and enhance electron mobility by creating a piezo-electric effect; SiGe is the source of the stress). As illustrated in FIG. 1, the CFET transistor 100 further includes dummy polysilicon 116, SiGe layers 118, silicon nanosheets 120, inner spacers 122 of, for example, a low k material (i.e., a small dielectric constant), nitride (e.g., silicon nitride—SiN) layers 124, oxide layer(s) 126 and oxynitride (SiON) 128.

Manufacturing the structure illustrated in FIG. 1 using realistic unit processes available today in the industry, with optimal manufacturability and robustness poses a challenge. Upper and lower level epitaxy cannot be done simultaneously because the upper level source and drain epitaxy and the lower level source and drain epitaxy must be made of different materials and dopants.

FIG. 2A illustrates a two-dimensional view of the upper level and the lower level of an unfinished CFET structure (prior to any epitaxial growth) being comprised of different materials and doping types and FIG. 2B illustrates a three-dimensional view of the upper level and the lower level of an unfinished CFET structure (after upper level epitaxial growth) being comprised of different materials and doping types and illustrates potential problems with performing the upper level epitaxial growth before the lower level epitaxial growth.

Specifically, FIG. 2A illustrates an unfinished CFET 100 structure (prior to epitaxial growth) including the dummy polysilicon 116, the SiGe layers 118, the silicon nanosheets 120, inner spacers 122, oxide layer(s) 126, a silicon substrate 114 and nitride (e.g., silicon nitride—SiN) layers 124. These reference elements of FIGS. 2A are described above with reference to FIG. 1.

Specifically, FIG. 2B illustrates an unfinished CFET structure 100, which is similar to FIG. 2A, except that FIG. 2B provides a 3-dimensional illustration and illustrates upper level source and drain epitaxy 102. Note that because of the different material and doping types included in the unfinished CFET structure 100, the upper level epitaxy 102 and the lower level epitaxy cannot be simultaneously grown. FIG. 2B illustrates that the source and drain epitaxy 102 is confined by vertical dividers 202 made of, for example, a nitride (e.g., silicon nitride—SiN). As a result, the upper level source and drain epitaxy 102 will block access to the lower level silicon nanosheet 120 for epitaxial growth. Specifically, performing epitaxial growth at the upper level first is problematic, because, as illustrated in FIG. 2B, the growth of the upper level source and drain epitaxy 102 will block access to the lower level as a result of confinement by the vertical dividers 202. The technology disclosed solves this problem by starting with the lower level epitaxy 108 first (see FIG. 1), followed by the upper level epitaxy 102.

Figure 3:
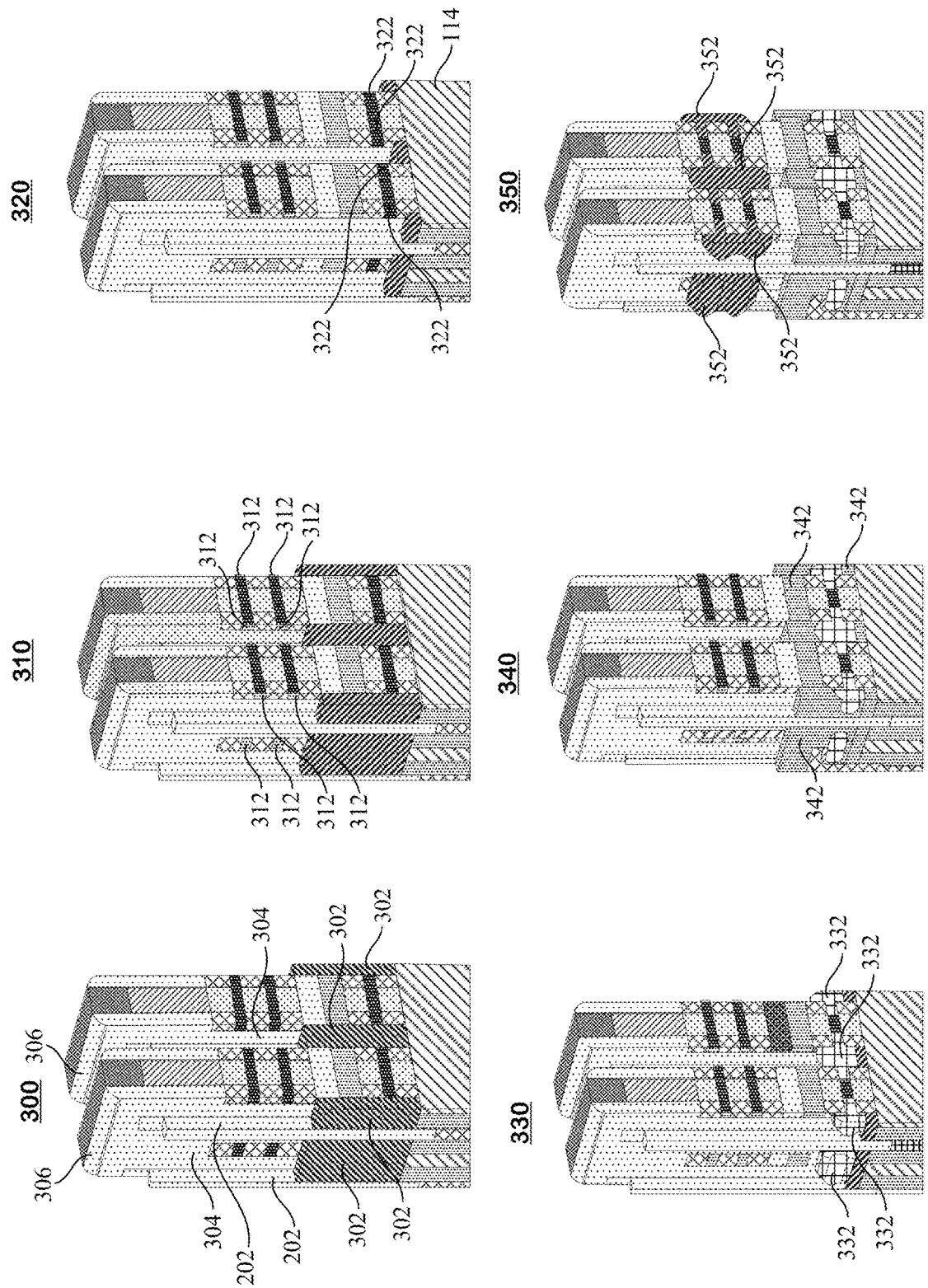
FIG. 3 illustrates a high-level process of performing lower level epitaxial growth and then performing upper level epitaxial growth of the CFET structure, according to an aspect of the technology disclosed.

FIG. 3 illustrates a high-level process of performing lower level epitaxial growth and then performing upper level epitaxial growth of the CFET structure.

Specifically, FIG. 3 illustrates the following process implemented by the technology disclosed. The process includes an operation 300 of adding a blocking layer 302 to the lower level of one or more vertical channels 304 of an unfinished CFET structure to block (separate) the upper level from the lower level. The blocking layer 302 can include at least one of a carbon-based material, an oxide (e.g., aluminum oxide), silicon nitride-base materials, and carbon-doped silicon oxide (SiCOH). As illustrated, the vertical channels 304 can be formed by the vertical dividers 202 and can be formed between two walls 306 of the CFET structure.

The process also includes an operation 310 of oxidizing silicon (e.g., oxidizing one or more silicon nanosheets) to provide a $SiO_2$ protective layer 312 at a surface of the upper level (e.g., at surfaces of one or more silicon nanosheets) to separate and protect the upper level silicon nanosheet(s) from lower level epitaxial grown. Note that reference element 312 merely identifies some oxidation surface layers on upper level silicon nanosheets.

The process further includes an operation 320 of exposing silicon 322 (e.g., the silicon nanosheet) to at least one of the vertical channels 304 while continuing to protect the silicon substrate 114 with the blocking layer 302.

The process also includes an operation 330 of performing silicon epitaxial growth 332 on the lower level of the unfinished CFET structure.

Moreover, the process includes an operation 340 of covering the epitaxial growth with another blocking layer (e.g., carbon or oxide) 342.

The process also includes an operation 350 of removing the $SiO_2$ protective layer 312 and performing silicon epitaxial growth 352 on the upper level of the CFET structure.

Figure 4A:
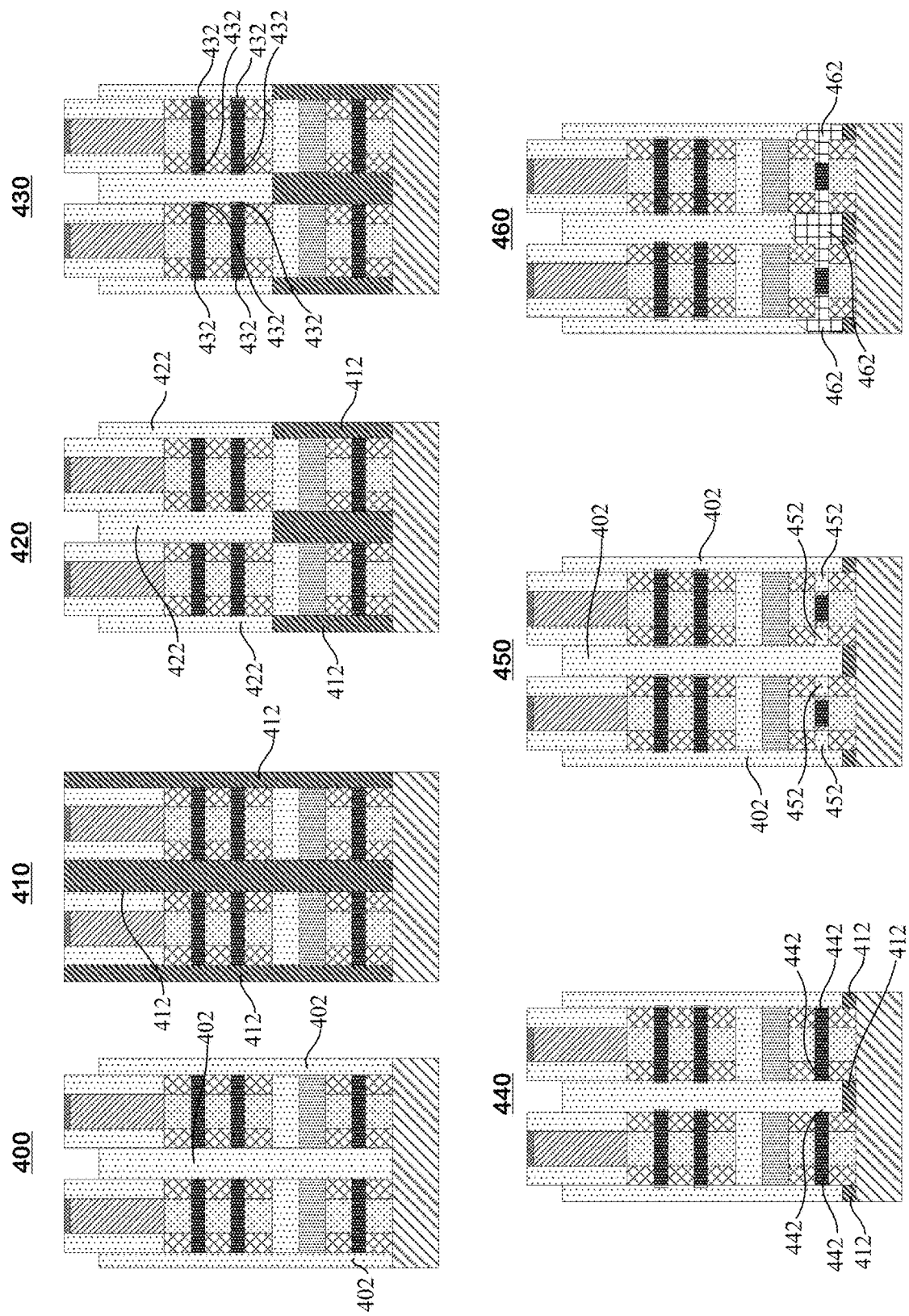
FIGS. 4A and 4B illustrate a detailed process of performing lower level epitaxial growth and then performing upper level epitaxial growth of the CFET structure, according to an aspect of the technology disclosed.
Figure 4B:
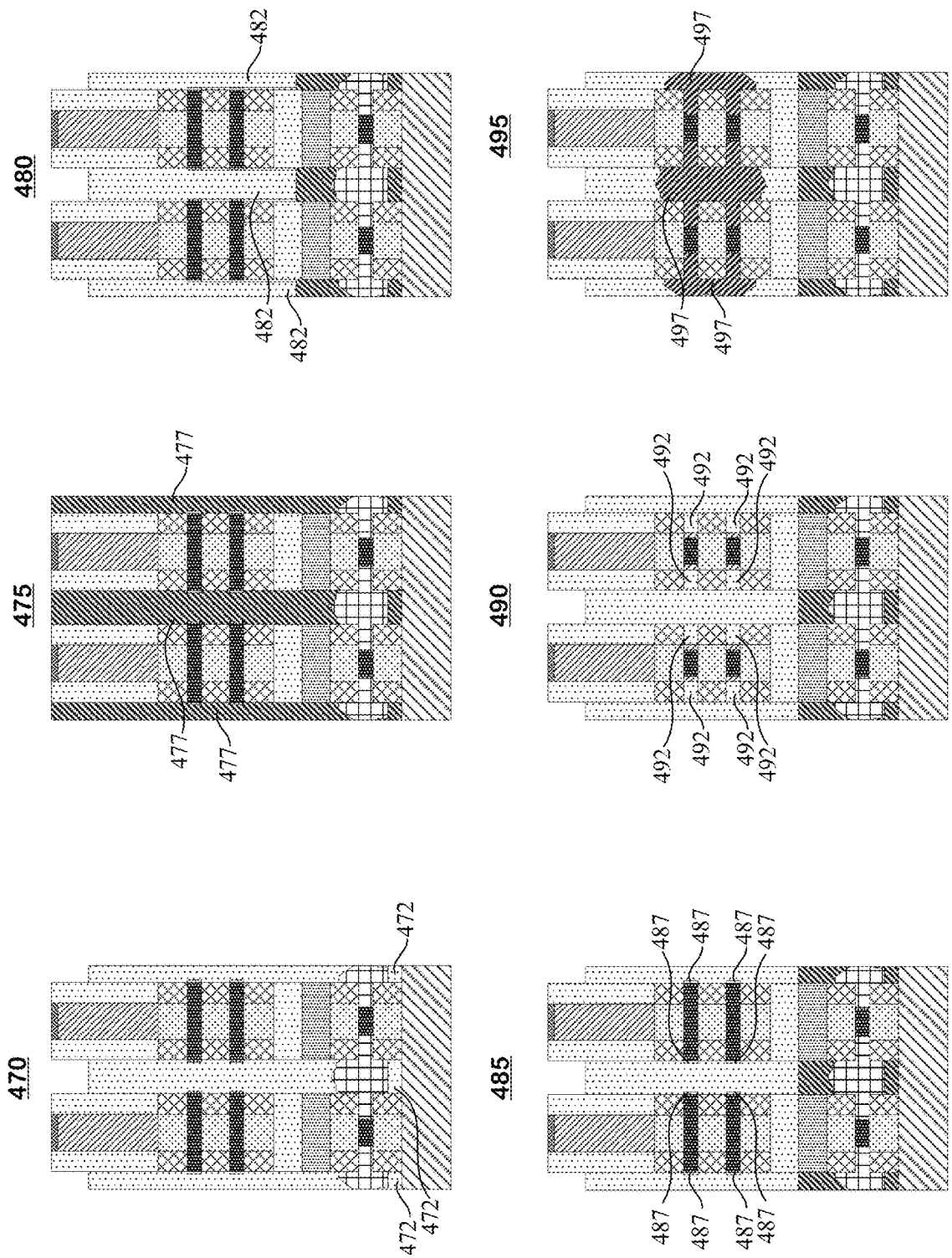

FIGS. 4A and 4B illustrate a more detailed process of performing lower level epitaxial growth and then performing upper level epitaxial growth of the CFET structure.

The process includes an operation 400 of obtaining an unfinished CFET structure that includes one or more vertical channels 402. The vertical channels can be formed by the vertical dividers 202 comprised of nitride (see reference element 124 of FIG. 1).

The process further includes an operation 410 of depositing a first blocking material 412 in the one or more vertical channels 402 of the unfinished CFET. The first blocking material 412 can include a carbon-based material, aluminum oxide, silicon nitride-based materials, and/or carbon-doped silicon oxide (SiCOH).

Additionally, the process includes an operation 420 of etching away a portion of the deposited first blocking material 412 (e.g., a first etch-back of the deposited first blocking material 412) to expose portions 422 of the vertical channels 402 (e.g., in the upper level) to re-expose portions of the vertical dividers 202 comprised of nitride and to leave a desired amount of the first blocking material 412 in the lower level of the CFET structure, so as to separate the upper level from the lower level.

Furthermore, the process includes an operation 430 of oxidizing silicon (e.g., portions of the silicon nanosheets 404 that are exposed to the vertical channels 402) on the upper level of the CFET structure to provide one or more $SiO_2$ protective layers 432 in the upper level.

The process also includes an operation 440 of further etching away a portion of the first blocking material 412 (e.g., a second etch-back of the deposited first blocking material 412). This etching can expose, in the lower level, portions of silicon 442 (e.g., the silicon nanosheets) to the vertical channels 402, but can leave a desired amount of the first blocking material 412 in the lower level. Specifically, the first blocking material 412 can be completely removed from the vertical channels 402 (not illustrated) or some of the first blocking material 412 can be left in the vertical channels 402 to separate the vertical channels 402 from the silicon substrate 114 (see operation 440 in which the first blocking material 412 remains in the vertical channels 402 above the silicon substrate 114).

In operation 450 a portion of the silicon 442 (e.g., the silicon nanosheets) is etched away from the lower level of the unfinished CFET structure. This etching can form one or more lateral recesses 452 in the silicon. The one or more lateral recesses 452 can be exposed to the vertical channels 402. Further, this can be done using various types of etching including, but not limited to, chemical etching, plasma etching, isotropic etching, to selectively remove the silicon without affecting other portions of the lower level of the unfinished CFET structure.

Further, the process includes an operation 460 of performing silicon epitaxial growth 462 on the lower level of the unfinished CFET structure. As illustrated, the epitaxial growth occurs in (at least a portion of) the lateral recesses 452 as well as in the vertical channels 402. The silicon epitaxial growth 462 performed on the lower level of the unfinished CFET can be SiGe epitaxial growth. For example, this silicon growth can be p+ S/D epitaxy (p+ SiGe).

The process can further include an operation 470 of removing a remainder of the first blocking material 412 if any of the first blocking material 412 remains. As illustrated, the first blocking material 412 is removed from locations 472. If all of the first blocking material 412 has been removed by previous etching, then operation 470 is not necessary and it can be skipped.

The process also includes an operation 475 of depositing a second blocking material 477 in the vertical channels 402. The second blocking material can also be deposited in the locations 472 illustrated in operation 470. The second blocking material 477 can be the same material as the first blocking material 412 or it can be different from the first blocking material 412. The second blocking material 477 can be a different material than the material of the other layers of the unfinished CFET structure.

In operation 480 a portion of the second blocking material 477 is etched away from the upper level to leave a desired amount of the second blocking material 477 in the lower level of the unfinished CFET structure. This etching away of the second blocking material 477 leaves portions 482 of the vertical channels 402 exposed.

The process also includes an operation 485 that removes, at locations 487, one or more of the protective layers (e.g., one or more of the SiO$_2$ protective layers) 432 added in operation 430. The one or more protective layers 432 can be removed using any of the various types of etching, as described above. Operation 485 illustrates locations 487 at which the one or more protective layers 432 have been removed.

The process further includes an operation 490 that includes etching away a portion of silicon from the upper level of the unfinished CFET structure. The silicon that is etched away from the upper level can be a silicon nanosheet 120 (see FIG. 1). The etched away silicon can form one or more lateral recesses 492 that are exposed to the vertical channels 402.

The process also includes an operation 495 of performing silicon epitaxial growth 497 on the upper level of the unfinished CFET structure. As illustrated, the epitaxial growth occurs in the lateral recesses 492 as well as in the vertical channels 402. The epitaxial growth 497 performed on the upper level of the unfinished CFET can be Si or carbon doped Si epitaxial growth. For example, the silicon epitaxial growth 497 can be n+ S/D epitaxy (n+ doped silicon).

The first and second blocking materials 412, 477 can possess good etch selectivity relative to the rest of materials in the CFET structure. As discussed above, there can be two partial etches of the first blocking material 412, which can be achieved with timed plasma or wet etch. The above-describe silicon oxidation can be done in dry ambient with O$_2$ or H$_2$O or wet chemicals.

Figure 5:
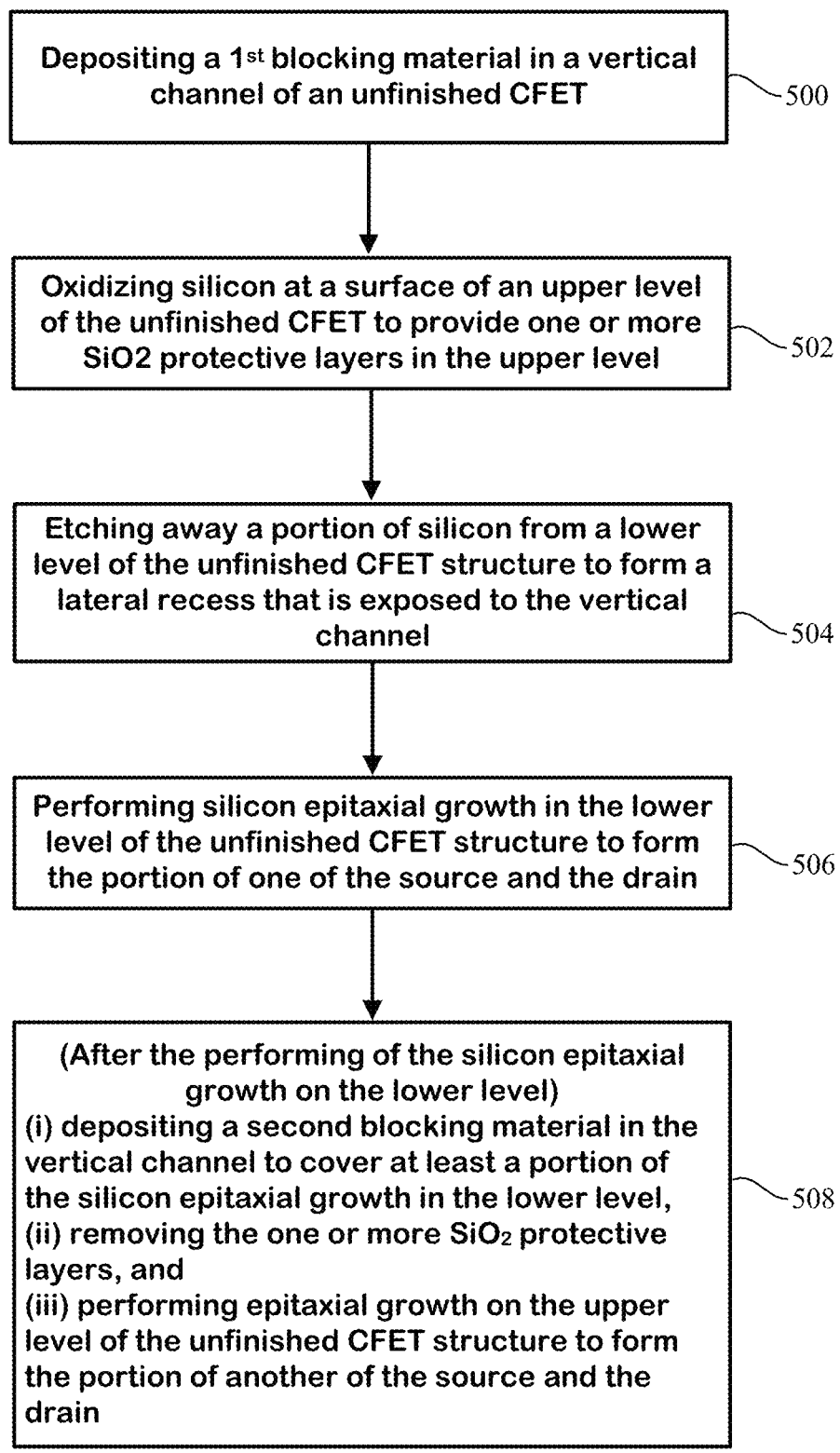
FIG. 5 illustrates a flowchart describing operations for performing epitaxial growth to form at least a portion of a source and a drain on multiple levels of the CFET structure.
Figure 6:
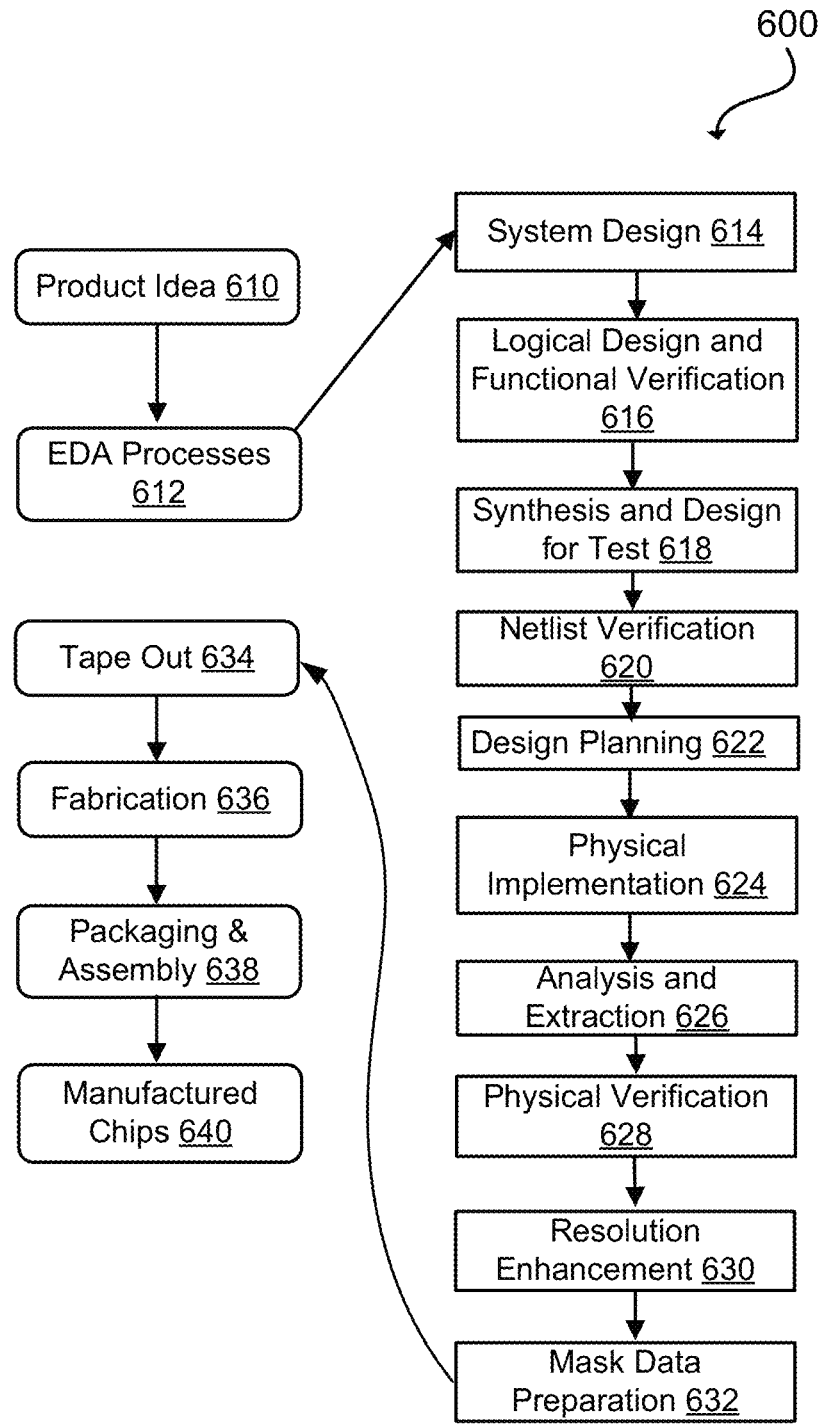
FIG. 6 depicts a flowchart of various processes used during the design and manufacture of an integrated circuit in accordance with some aspects of the technology disclosed.

FIG. 5 illustrates a flowchart describing operations for performing epitaxial growth to form at least a portion of a source and a drain on multiple levels of a CFET structure. The operations can include an operation 500 of depositing a first blocking material in a vertical channel of an unfinished CFET structure. The operations can further include an operation 502 of oxidizing silicon at a surface of an upper level of the unfinished CFET structure to provide one or more SiO$_2$ protective layers in the upper level. The operations can further include an operation 504 of etching away a portion of silicon from a lower level of the unfinished CFET structure to form a lateral recess that is exposed to the vertical channel. The operations can also include an operation 506 of performing silicon epitaxial growth in the lower level of the unfinished CFET structure to form the portion of one of the source and the drain. The operations further include an operation 508 of, after the performing of the silicon epitaxial growth on the lower level, (i) depositing a second blocking material in the vertical channel to cover at least a portion of the silicon epitaxial growth in the lower level, (ii) removing the one or more SiO$_2$ protective layers, and (iii) performing epitaxial growth on the upper level of the unfinished CFET structure to form the portion of another of the source and the drain FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640. The above-described epitaxial growth of source and drain materials can be performed in this fabrication stage 636.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 6. The processes described by be enabled by EDA products (or tools).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 600 of FIG. 6) may be used to store the programs and data structures that are used by some or all of the EDA products described herein, and products used for development of cells for the library and for physical and logical design that use the library.

Figure 7:
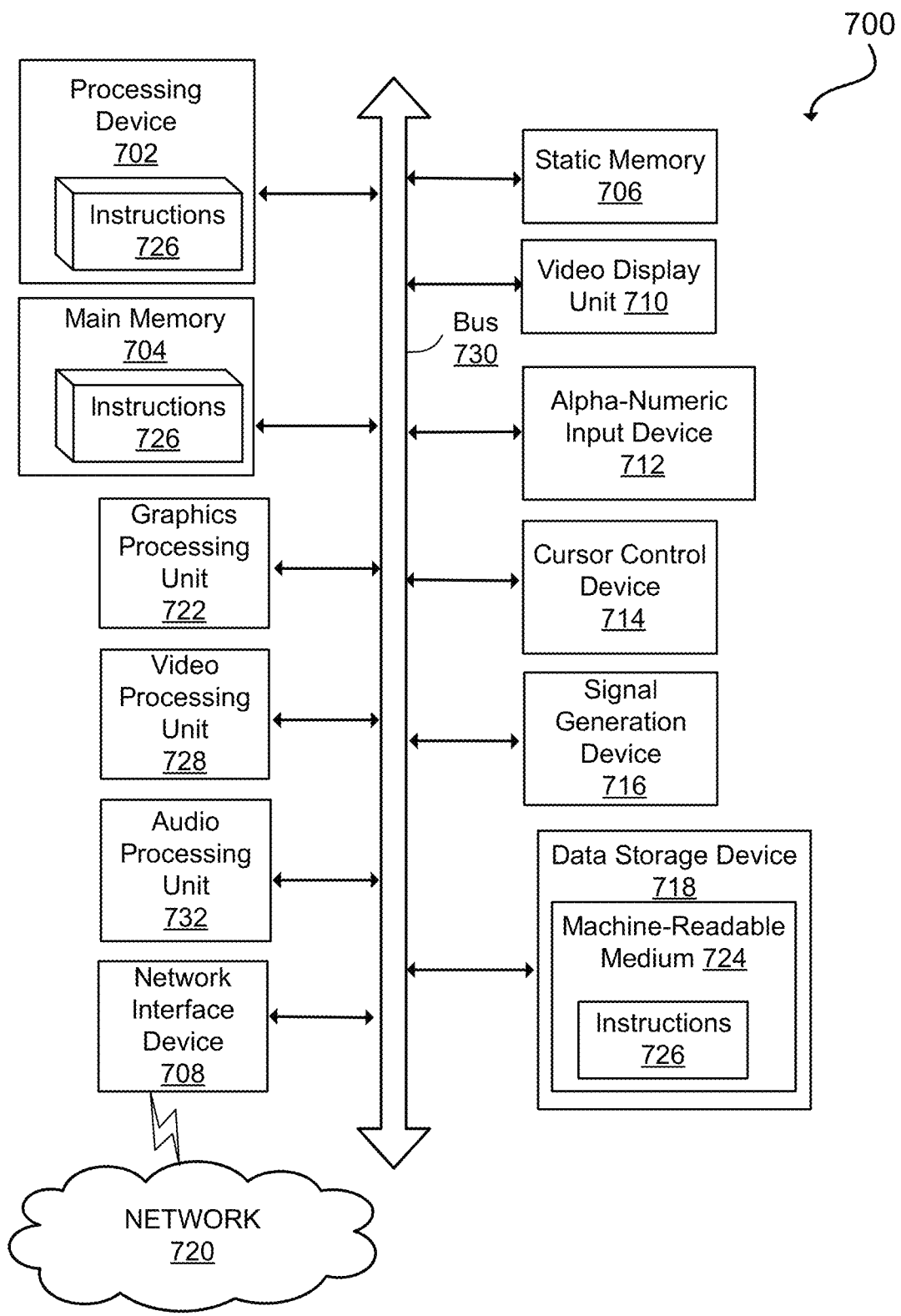
FIG. 7 depicts an abstract diagram of an example computer system in which aspects of the technology disclosed may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716

(e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

We claim as follows:

1. A method of performing epitaxial growth to form at least a portion of a source and a drain on multiple levels of a complementary field effect transistor (CFET), the method comprising:
   depositing a first blocking material in a vertical channel of an unfinished CFET structure;
   oxidizing silicon at a surface of an upper level of the unfinished CFET structure to provide one or more $SiO_2$ protective layers in the upper level;
   etching away a portion of silicon from a lower level of the unfinished CFET structure to form a lateral recess that is exposed to the vertical channel;
   performing silicon epitaxial growth in the lower level of the unfinished CFET structure including at least a portion of the lateral recess to form the portion of one of the source and the drain; and
   after the performing of the silicon epitaxial growth on the lower level:
      depositing a second blocking material in the vertical channel to cover at least a portion of the silicon epitaxial growth in the lower level;
      removing the one or more $SiO_2$ protective layers; and
      performing epitaxial growth on the upper level of the unfinished CFET structure to form the portion of another of the source and the drain.

2. The method of claim 1, wherein the upper level forms a negative-channel metal oxide semiconductor and the lower level forms a positive-channel metal oxide semiconductor.

3. The method of claim 1, wherein the first blocking material includes at least one of a carbon-based material, aluminum oxide, silicon nitride-based materials, and carbon-doped silicon oxide (SiCOH).

4. The method of claim 1, further comprising prior to the oxidizing of the silicon at the surface of the upper level, performing a first partial etch-back of the deposited first blocking material to leave some of the first blocking material in the vertical channel in the lower level.

5. The method of claim 4, further comprising, after the oxidizing of the silicon at the surface of the upper level, performing a second etch-back of the deposited first blocking material by removing a remainder of the first blocking material from the vertical channel.

6. The method of claim 4, further comprising, after the oxidizing of the silicon at the surface of the upper level, performing a second etch-back of the deposited first blocking material by etching away a desired portion, but not all, of the first blocking material from the vertical channel.

7. The method of claim 1, wherein the portion of the silicon etched away is a portion of a silicon nanosheet.

8. The method of claim 1, wherein the etching away of the portion of the silicon from the lower level is performed using at least one of chemical etching, plasma etching and isotropic etching, to selectively remove the silicon without affecting other portions of the lower level.

9. The method of claim 1, wherein the silicon epitaxial growth performed on the lower level is SiGe epitaxial growth.

10. The method of claim 9, wherein the silicon epitaxial growth on the lower level is p+ S/D epitaxy to form p+ SiGe.

11. The method of claim 1, further comprising, after the performing of the silicon epitaxial growth on the lower level, removing a remainder of the first blocking material from the vertical channel.

12. The method of claim 1, wherein the second blocking material is the same material as the first blocking material.

13. The method of claim 1, wherein the second blocking material is different from the first blocking material.

14. The method of claim 1, further comprising etching back the second blocking material from the upper level to leave a desired amount of the second blocking material in the lower level.

15. The method of claim 1, further comprising, after the removing of the one or more $SiO_2$ protective layers, etching away a portion of silicon from the upper level to form a lateral recess that is exposed to the vertical channel.

16. The method of claim 15, wherein the portion of the silicon that is etched away from the upper level is a portion of a silicon nanosheet.

17. The method of claim 1, wherein the silicon epitaxial growth performed on the upper level is SiGe epitaxial growth.

18. The method of claim 17, wherein the epitaxial growth on the upper level is n+ S/D epitaxy to form n+ doped silicon.

19. A system for performing epitaxial growth to form at least a portion of a source and a drain on multiple levels of a complementary field effect transistor (CFET), the system comprising:
a memory storing instructions; and
a processor, coupled with the memory and to execute the instructions, the instructions when executed cause the processor to:
deposit a first blocking material in a vertical channel of an unfinished CFET structure;
oxidize silicon at a surface of an upper level of the unfinished CFET structure to provide one or more $SiO_2$ protective layers in the upper level;
etch away a portion of silicon from a lower level of the unfinished CFET structure to form a lateral recess that is exposed to the vertical channel;
perform silicon epitaxial growth in the lower level of the unfinished CFET structure including at least a portion of the lateral recess to form the portion of one of the source and the drain; and
after the performing of the silicon epitaxial growth on the lower level:
deposit a second blocking material in the vertical channel to cover at least a portion of the silicon epitaxial growth in the lower level;
remove the one or more $SiO_2$ protective layers; and
perform epitaxial growth on the upper level of the unfinished CFET structure to form the portion of another of the source and the drain.

20. A non-transitory computer readable storage medium comprising stored instructions for performing epitaxial growth to form at least a portion of a source and a drain in multiple levels of a complementary field effect transistor (CFET), the instructions, when executed by a processor, cause the processor to implement operations comprising:
depositing a first blocking material in a vertical channel of an unfinished CFET structure;
oxidizing silicon at a surface of an upper level of the unfinished CFET structure to provide one or more $SiO_2$ protective layers in the upper level;
etching away a portion of silicon from a lower level of the unfinished CFET structure to form a lateral recess that is exposed to the vertical channel;
performing silicon epitaxial growth in the lower level of the unfinished CFET structure including at least a portion of the lateral recess to form the portion of one of the source and the drain; and
after the performing of the silicon epitaxial growth on the lower level:
depositing a second blocking material in the vertical channel to cover at least a portion of the silicon epitaxial growth in the lower level;
removing the one or more $SiO_2$ protective layers; and
performing epitaxial growth on the upper level of the unfinished CFET structure to form the portion of another of the source and the drain.

* * * * *